(12) United States Patent
Liu

(10) Patent No.: US 8,680,594 B2
(45) Date of Patent: Mar. 25, 2014

(54) SEMICONDUCTOR CONSTRUCTIONS AND METHODS OF FORMING SEMICONDUCTOR CONSTRUCTIONS

(71) Applicant: Micron Technology, Inc., Boise, ID (US)

(72) Inventor: Zengtao T. Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/017,939

(22) Filed: Sep. 4, 2013

(65) Prior Publication Data

US 2014/0008807 A1    Jan. 9, 2014

Related U.S. Application Data

(62) Division of application No. 13/480,677, filed on May 25, 2012, now Pat. No. 8,551,844.

(51) Int. Cl.
*H01L 27/108* (2006.01)

(52) U.S. Cl.
USPC ............................ 257/296; 438/296; 438/199

(58) Field of Classification Search
USPC ................. 438/437, 128, 478, 296, 597, 199; 257/786; 365/103
See application file for complete search history.

(56) References Cited

U.S. PATENT DOCUMENTS

| 6,777,725 | B2 | 8/2004 | Willer et al. |
| 7,179,744 | B2 | 2/2007 | Lee et al. |
| 7,365,000 | B2 | 4/2008 | Lee et al. |
| 7,488,644 | B2 | 2/2009 | Lee et al. |

*Primary Examiner* — Julio J Maldonado
*Assistant Examiner* — Robert Bachner
(74) *Attorney, Agent, or Firm* — Wells St. John P.S.

(57) ABSTRACT

Some embodiments include methods in which first insulative material is formed across a memory region and a peripheral region of a substrate. An etch stop structure is formed to have a higher portion over the memory region than over the peripheral region. A second insulative material is formed to protect the lower portion of the etch stop structure, and the higher portion is removed. Subsequently, at least some of the first and second insulative materials are removed. Some embodiments include semiconductor constructions having a first region with first features, and a second region with second features. The first features are closer spaced than the second features. A first insulative material is over the second region and an insulative structure is over the first insulative material. The structure has a stem joined to a bench. The bench has an upper surface, and the stem extends to above the upper surface.

9 Claims, 12 Drawing Sheets

SEMICONDUCTOR CONSTRUCTIONS AND METHODS OF FORMING SEMICONDUCTOR CONSTRUCTIONS

RELATED PATENT DATA

This patent resulted from a divisional of U.S. patent application Ser. No. 13/480,677, which was filed May 25, 2012, and which is hereby incorporated herein by reference.

TECHNICAL FIELD

Semiconductor constructions and methods of forming semiconductor constructions.

BACKGROUND

Memory is one type of integrated circuitry, and is used in computer systems for storing data. Integrated memory is usually fabricated in one or more arrays of individual memory cells. Additional integrated circuitry may be formed on a common die as one or more memory arrays, with such additional integrated circuitry often being formed peripherally to the memory arrays so that it does not interrupt repeating patterns within the memory arrays. The additional circuitry may be configured for any of numerous applications. For instance, the additional circuitry may be configured to read and/or program the memory arrays.

Memory arrays may be highly integrated, and accordingly formed to very small pitches. In contrast, peripheral circuitry may be less highly-integrated than the arrays, and accordingly formed to larger pitches than the circuitry of the memory arrays.

It may be desirable to form interconnects to integrated circuitry of a memory array, while simultaneously forming interconnects to integrated circuitry in a region peripheral to the memory array. In some applications, it is desired to remove material from between tightly-spaced components of a memory array prior to forming the interconnects, and to protect the periphery with an etch stop during such removal to avoid damage to the peripheral circuitry. The etch stop is patterned to be over the periphery and not the array, and such patterning may be accomplished utilizing a photolithographically-patterned mask. However, the formation and utilization of such mask adds complexity to a fabrication process, which increases costs and introduces risks of mask misalignment. It would therefore be desirable to develop new methods of patterning an etch stop to be over a periphery region and not a memory region which avoid utilization of the photolithographically-patterned mask. It would be further desirable for such methods to be suitable for formation of etch stops in other applications in which an etch stop is to be selectively formed over a less highly-integrated region relative to a more highly-integrated region.

DETAILED DESCRIPTION OF THE ILLUSTRATED EMBODIMENTS

Figure 1:
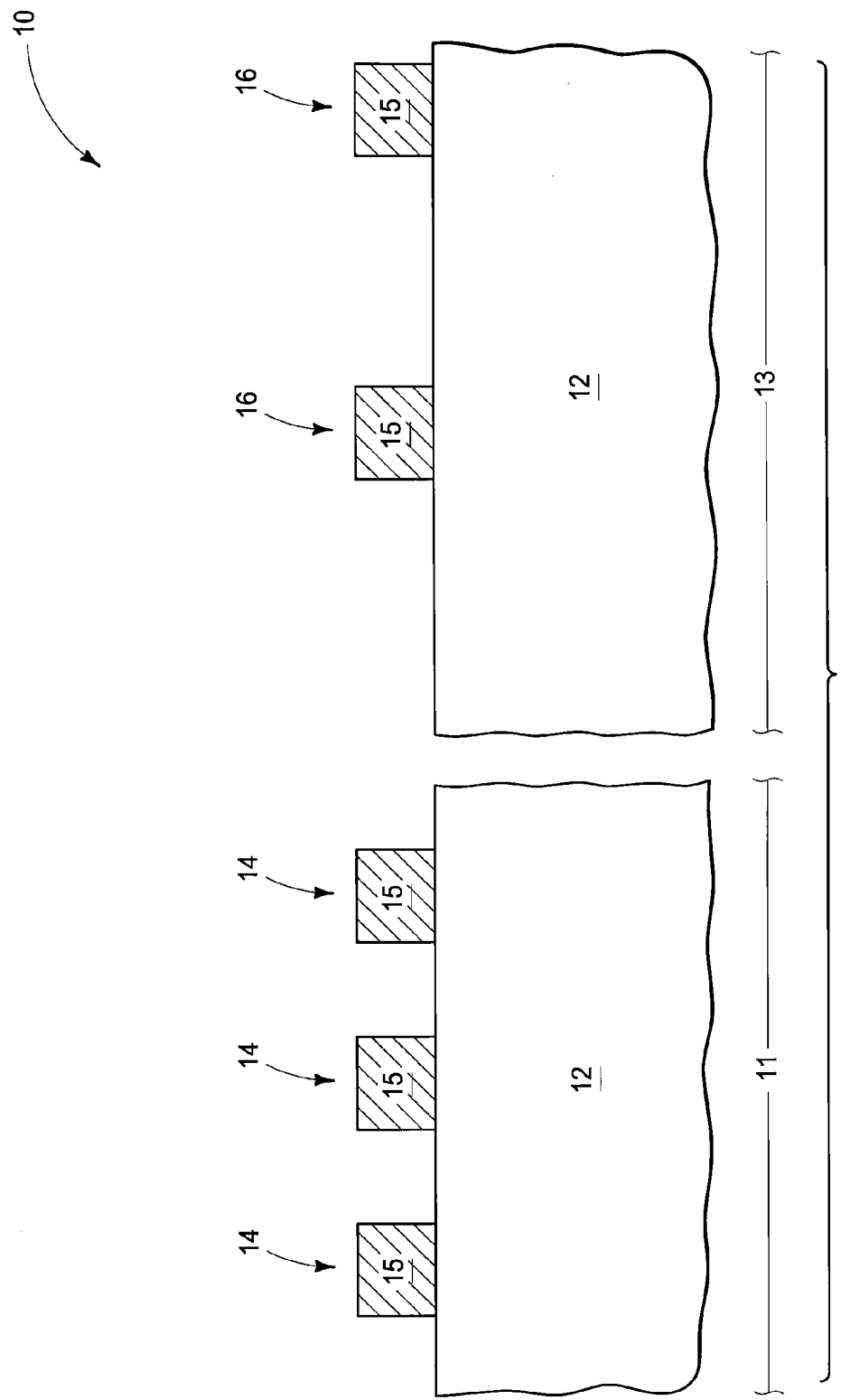
FIG. 1 is a diagrammatic cross-sectional view of a region of an example embodiment semiconductor construction.

FIG. 1 illustrates an example embodiment semiconductor construction 10. The construction comprises a semiconductor base 12 having features 14 and 16 thereover.

The base 12 may comprise, consist essentially of or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous materials in some embodiments. For instance, base 12 may correspond to a semiconductor substrate containing one or more materials associated with integrated circuit fabrication. In such embodiments, such materials may correspond to one or more of refractory metal materials, barrier materials, diffusion materials, insulator materials, etc.

The features 14 are and 16 illustrated to comprise electrically conductive material 15. Such material may be of any suitable composition or combination of compositions; and in some embodiments may comprise, consist essentially of or consist of one or more of various metals (for instance, copper, platinum, tungsten, etc.), metal-containing compounds (for instance, metal silicides, metal carbide, metal nitrides, etc.) and conductively-doped semiconductor materials (for instance, conductively-doped silicon, conductively-doped germanium, etc.). The features may be at least partially wrapped with insulative material in some embodiments. Further, although the features are shown to comprise conductive material, in other embodiments the features may comprise, consist essentially of, or consist of semiconductor material and/or insulative material. Although the features 14 and 16 are shown to comprise the same electrically conductive material as one another, in other embodiments the features may comprise different electrically conductive materials relative to one another.

The construction 10 is shown to comprise a first region 11 and a second region 13, with the first region having a higher degree of integration (i.e., more closely-spaced features) than the second region. It is common to fabricate dice having multiple regions with differing degrees of integration relative to one another. For instance, the first region 11 may comprise a memory region, and the second region 13 may comprise a so-called peripheral region; with the term "peripheral" meaning that the second region is peripheral relative to the memory region. In some applications, the loosely-spaced circuitry of the peripheral region may comprise logic or other suitable circuitry for controlling operations of a memory array. The peripheral region may also comprise circuitry configured for coupling with components external of construction 10 and/or configured for numerous other applications (for instance, processors, sensors, etc.), depending on the particular application for which the construction 10 is designed.

In some applications, it may be desired to form an etch stop over the loosely-spaced features of region 13 to protect such features during subsequent etching occurring relative to the tightly-spaced features of region 11. Prior art methods, such as those referred to in the "background" section of this disclosure, utilize masking to pattern such etch stop. In some embodiments, the invention includes methods of patterning a suitable etch stop without masking.

Example embodiment methods are described with reference to FIGS. 2-12.

Figure 2:
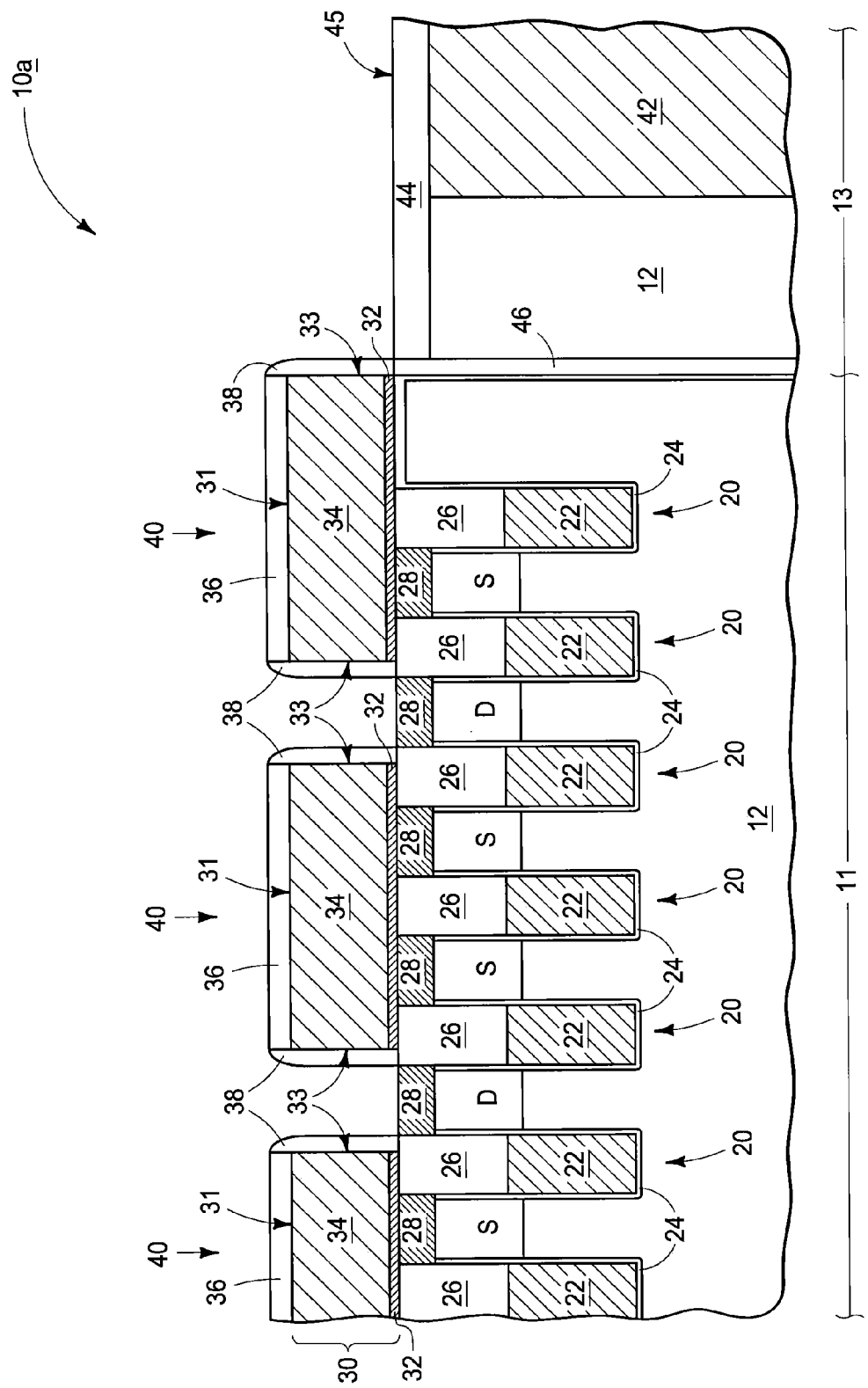
FIGS. 2-7 are diagrammatic cross-sectional views of a region of an example embodiment semiconductor construction at various process stages of an example embodiment method.

Referring to FIG. 2, an example embodiment semiconductor construction 10a is shown to comprise two regions 11 and 13; with region 11 being a memory region and region 13 being a region peripheral to the memory (i.e., being a "peripheral region").

The construction comprises a semiconductor material 12. Such material may comprise, consist essentially of, or consist of monocrystalline silicon in some embodiments. The semiconductor material may be considered part of a semiconductor substrate in some embodiments.

The memory region comprises a plurality of access transistors 20. Each transistor comprises electrically conductive gate material 22, and electrically insulative gate dielectric material 24 extending around the gate material. The material 22 may comprise any suitable electrically conductive composition; and in some embodiments may comprise one or more of various metals, metal-containing compounds and conductively-doped semiconductor materials. The gate dielectric 24 may comprise any suitable composition or combination of compositions; and in some embodiments may comprise, consist essentially of, or consist of one or both of silicon dioxide and silicon nitride.

The gate material 22 forms a plurality of transistor gates along the cross-section of FIG. 2, and source/drain regions are formed on opposing sides of the transistor gates. The source regions are labeled "S" and the drain regions are labeled "D."

Electrically insulative material 26 is over the gate material 22. Such electrically insulative may comprise any suitable composition or combination of compositions; and in some embodiments may comprise, consist essentially of, or consist of silicon nitride.

Electrically conductive contact material 28 is over the source and drain regions. Such material may comprise any suitable composition; and in some embodiments may comprise, consist essentially of, or consist of metal silicide.

Electrically conductive source lines 30 are over the source regions, and electrically coupled with the source regions. The source lines may extend in and out of the page relative to the cross-sectional view of FIG. 2. In the shown embodiment, the source lines comprise a first material 32 and a second material 34 over the first material. The materials 32 and 34 may comprise any suitable materials. In some embodiments, the material 32 may be a metal-containing material, such as, for example, a metal nitride or metal silicide; and the material 34 may comprise one or more of various metals, metal-containing compositions and conductively-doped semiconductor materials. For instance, material 34 may comprise, consist essentially of, or consist of conductively-doped polycrystalline silicon. In some embodiments, the first material 32 may be semi-conductive or insulative, and the second material 34 may be conductive. In some embodiments, both of the materials 32 and 34 may be conductive.

The source lines have top surfaces 31 and sidewall surfaces 33. In the shown embodiment, electrically insulative caps 36 are over the top surfaces 31. Such caps may comprise any suitable composition; and in some embodiments may comprise, consist essentially of, or consist of silicon nitride. The shown embodiment also has electrically insulative spacers 38 along the sidewall surfaces 33. Such spacers may comprise the same composition as caps 36 in some embodiments; and accordingly may comprise, consist essentially of, or consist of silicon nitride. In some embodiments, the spacers 38 and caps 36 may have thicknesses within a range of from about 10 nanometers to about 50 nanometers; such as, for example, thicknesses within a range of from about 20 nanometers to about 30 nanometers.

The caps 36 and spacers 38 may be together considered to form electrically insulative protective shells that cover the top and sidewall surfaces of source lines 30.

The source lines 30 together with the protective shells of materials 36 and 38 may be considered to correspond to a plurality of features 40 extending across memory region 11.

The various structures shown in the memory region 11 of FIG. 2 are conventional structures and may be formed with any suitable processing. It may assist in the understanding of some embodiments described herein to note that the features 40 may be formed by initially forming and patterning materials 32 and 34 of the source lines 30. Subsequently the protective shells of materials 36 and 38 may be formed by a process in which the caps 36 are formed and patterned across the top surfaces 31 of source lines 30 followed by formation of the sidewall spacers 38 by deposition and anisotropic etching of an electrically insulative material.

The features 40 may be considered to be an example of the closely-spaced features 14 shown in FIG. 1 in some embodiments.

The peripheral region 13 is shown to comprise an electrically conductive material 42, and to comprise electrically insulative material 44 over such conductive material. The conductive material 42 may comprise, for example, one or more of various metals, metal-containing compositions and conductively-doped semiconductor compositions. The electrically insulative material 42 may comprise any suitable composition or combination of compositions; and in some embodiments may comprise one or both of silicon dioxide and silicon nitride.

Another electrically insulative material 46 is shown along an interface between the peripheral region 13 and the memory region 11. Such electrically insulative material may comprise any suitable composition or combination of compositions; and in some embodiments may comprise one or both of silicon dioxide and silicon nitride.

The peripheral region has an upper surface 45. In some embodiments, the peripheral region may have no features above the upper surface 45 at the processing stage of FIG. 2; and in other embodiments the peripheral region may have some features (not shown) above such upper surface with such features being more widely spaced then the features 40 within the memory region. In some embodiments, the peripheral region 13 of FIG. 2 may be considered to comprise widely-spaced features analogous to the features 16 of FIG. 1, with the feature nearest to the memory region 11 being off the page, and thus outside of the portion of region 13 illustrated in FIG. 2.

The structures shown in peripheral region 13 may be formed with conventional processing.

Figure 3:
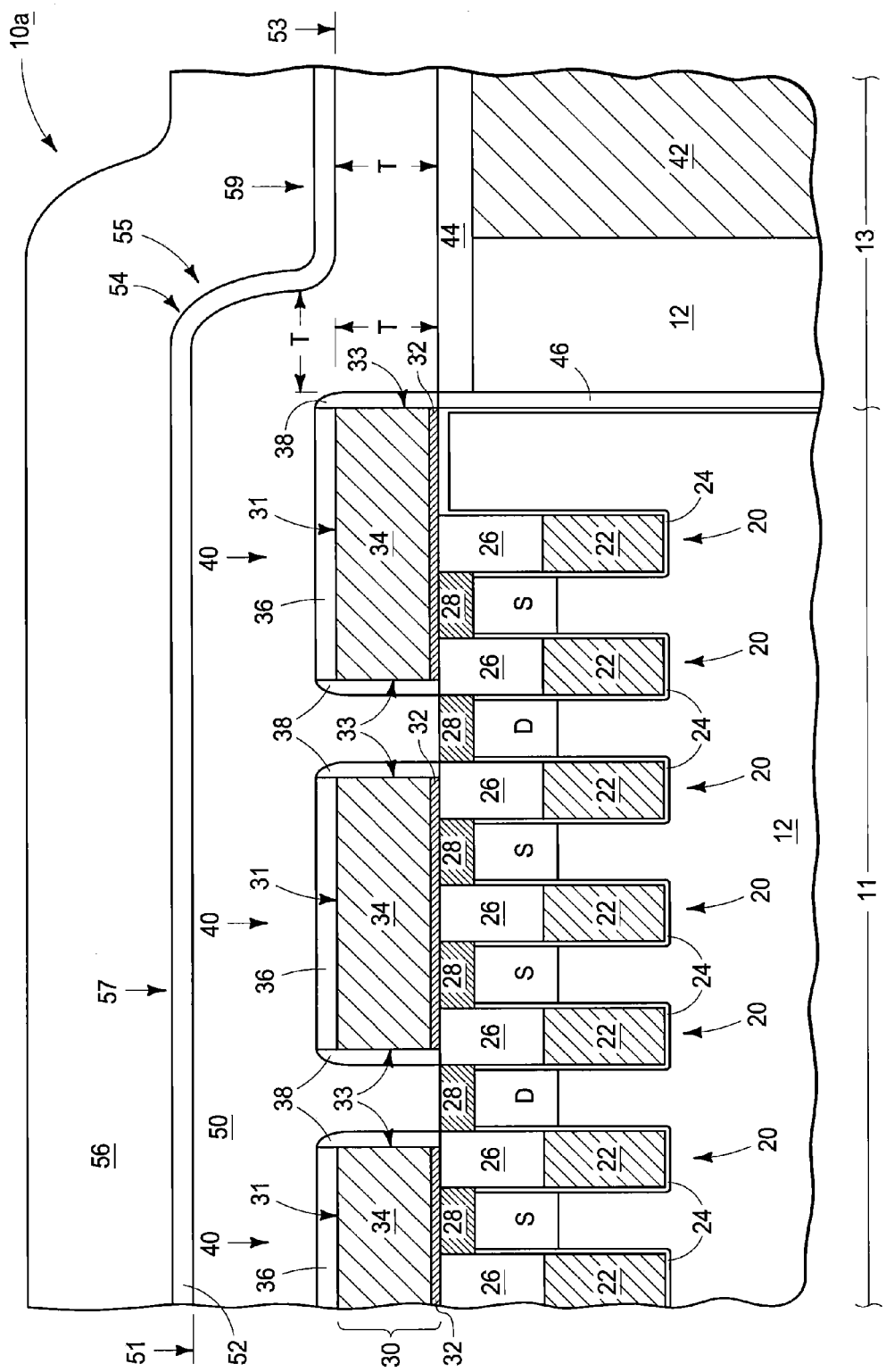

Referring to FIG. 3, a first electrically insulative material 50 is formed to extend across the memory region 11 and peripheral region 13. The electrically insulative material 50 may comprise any suitable composition; and in some example embodiments may comprise, consist essentially of, or consist of silicon dioxide. In such embodiments, material 50 may be referred to as a silicon dioxide-containing material.

The material 50 may be formed utilizing any suitable methodology. Example methodology may include one or both of atomic layer deposition (ALD) and chemical vapor deposition (CVD).

The material 50 extends over and between features 40 of the memory region. The material 50 has a thickness "T" approximately equal to the combined thicknesses of materials 32 and 34 (i.e., approximately equal to the thicknesses of source lines 30) in the shown embodiment. The material 50 is higher over the region 11 than the thickness T due to the features 40 being too closely spaced to allow material 50 to conformally fill spaces between the features. In contrast, material 50 has a height over peripheral region 13 approximately equal to the thickness T in that the features across material 13 (not shown) are spaced-apart by suitable distances to enable material 50 to conformally fill gaps between such features. The differing height of an upper surface of material 50 over memory region 11 relative to peripheral region 13 may be described by indicating that material 50 is formed to a first level 51 over the memory region 11, and to a second level 53 over the peripheral region 13. The material 50 drops from the first level 51 to the second level 53 in a transition region 55 where the peripheral region interfaces with the memory region. In some embodiments, T may be at least about 50 nanometers, at least about 200 nanometers, or at least about 300 nanometers.

A second electrically insulative material 52 is formed over the first electrically insulative 50, with the second electrically insulative material 52 having a different composition than the first electrically insulative material 50. The electrically insulative material 52 may comprise any suitable composition; and in some example embodiments may comprise, consist essentially of, or consist of silicon nitride. In such embodiments, material 52 may be referred to as a silicon nitride-containing material. The material 52 ultimately forms an etch stop over peripheral region 13, and thus may be referred to as an etch stop material in some embodiments.

The material 52 may be formed utilizing any suitable methodology. Example methodology may include one or both of ALD and CVD.

The material 52 is formed conformally over material 50, and thus forms an electrically insulative structure 54 having a higher portion 57 over the memory region 11 and a lower portion 59 over the peripheral region 13. In some embodiments, the structure 54 may be referred to as an etch stop material structure.

The material 52 may be formed to any suitable thickness, and in some embodiments may have a thickness similar to, or substantially identical to, the thicknesses of electrically insulative caps 36. Accordingly, material 52 may have a thickness within a range of from about 10 nanometers to about 50 nanometers; such as, for example, a thickness within a range of from about 20 nanometers to about 30 nanometers. In some embodiments, material 52 may comprise the same composition as caps 36; and in such embodiments the caps 36 and material 52 may both comprise, for example, silicon nitride.

A third material 56 is formed over material 52. Material 56 may be a sacrificial material, and in such embodiments may be semiconductive, electrically conductive, or electrically insulative. In some example embodiments, material 56 is an electrically insulative material having the same composition as material 50. For instance, in some embodiments both of materials 50 and 56 may comprise, consist essentially of or consist of silicon dioxide. In such embodiments material 50 may be referred to as a first silicon dioxide-containing material and material 56 may be referred to as a second silicon dioxide-containing material.

Figure 4:
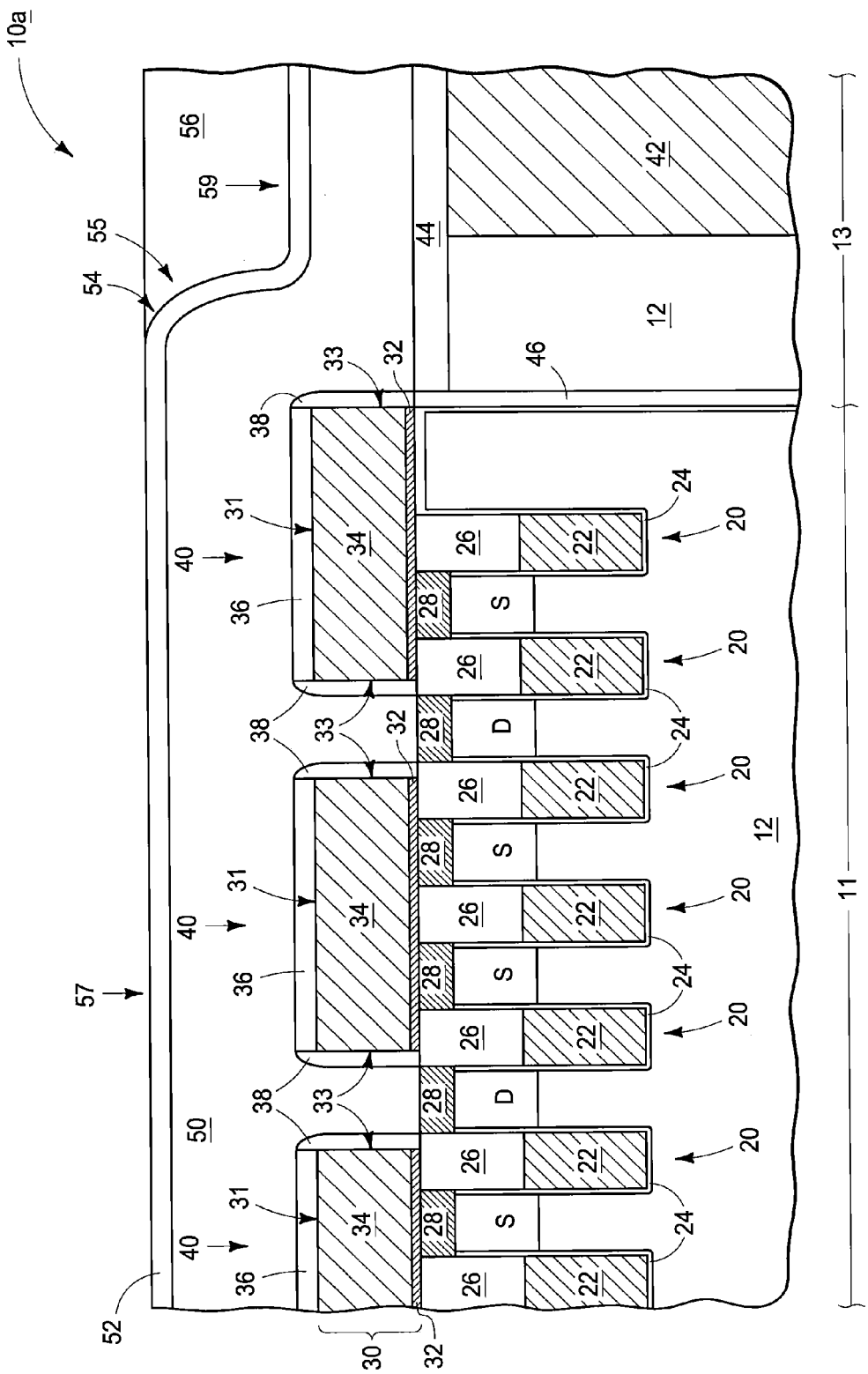

Referring to FIG. 4, material 56 is removed from over the higher portion 57 of structure 54, while leaving material 56 over the lower portion 59 of such structure. Such removal may be accomplished with any suitable processing. In some embodiments, the removal is accomplished utilizing chemical-mechanical polishing (CMP) under conditions which remove material 56 and stop on the material 52 of structure 54.

Figure 5:
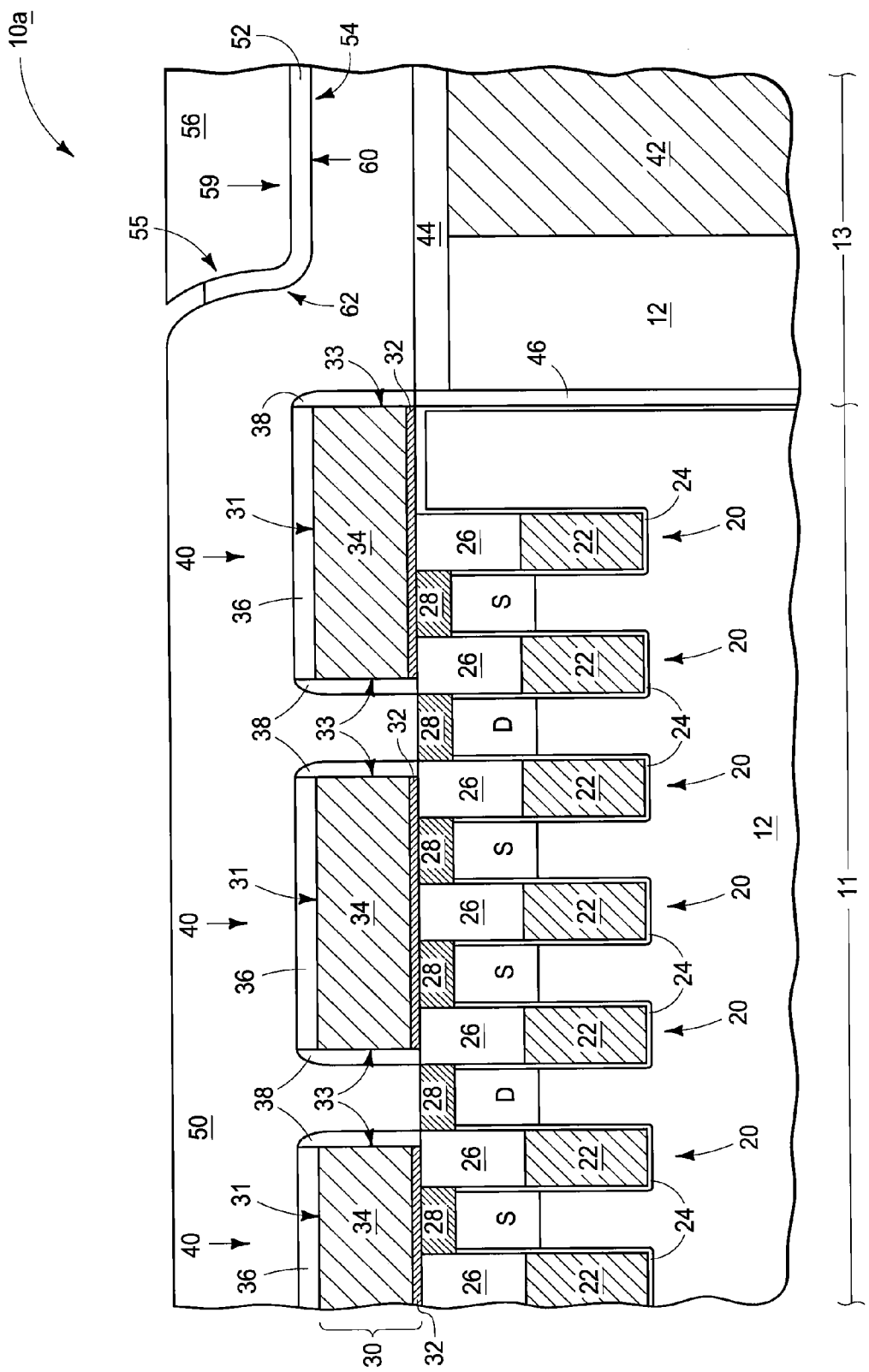

The removal of material 56 from over upper portion 57 may enable the upper portion to be selectively removed relative to the lower portion 59, as shown in FIG. 5. The upper portion 57 (FIG. 4) may be removed with any suitable processing. For instance, if material 52 comprises silicon nitride and materials 50 and 56 comprise silicon dioxide, the exposed portion of material 52 may be removed with a wet etch selective for the silicon nitride relative to the silicon dioxide (for instance, an etch utilizing phosphoric acid).

The etching may remove some of the material 52 from within transition region 55, while leaving a "tail" 62 of such material 52 within the transition region. In some embodiments, the remaining structure 54 of material 52 at the processing stage of FIG. 5 may be considered to be configured to comprise a horizontally-extending bench 60 joined to the tail (which may also be referred to as an upwardly-extending stem) 62.

Figure 6:
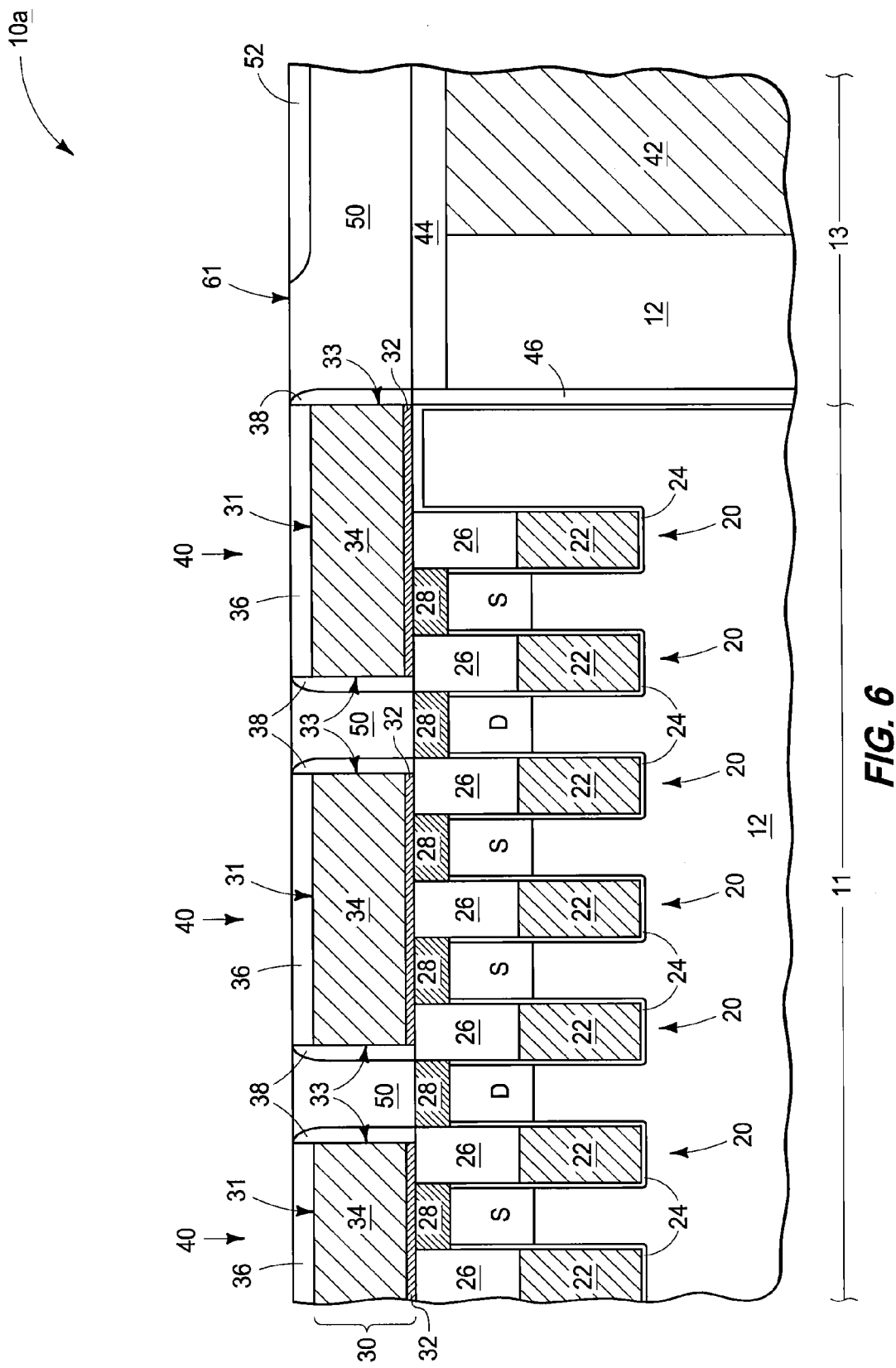

Referring to FIG. 6, the material 52 and caps 36 are utilized as an etch stop during planarization. Such planarization may be accomplished utilizing any suitable methodology, such as, for example, CMP. The planarization removes material 56 (FIG. 5) from over the peripheral region 13, removes material 50 from over caps 36, and removes the upwardly-extending stem 62 (FIG. 5) of material 52. Although the entirety of stem 62 (FIG. 5) is removed in the shown embodiment, in other embodiments only some of the stem may be removed. The planarization forms a planarized upper surface 61 extending across material 52 and caps 36. The planarized surface 61 also extends across regions of material 50 left between features 40 in the memory region 11, and extends across a region of material 50 left adjacent material 52 in the peripheral region 13.

Figure 7:
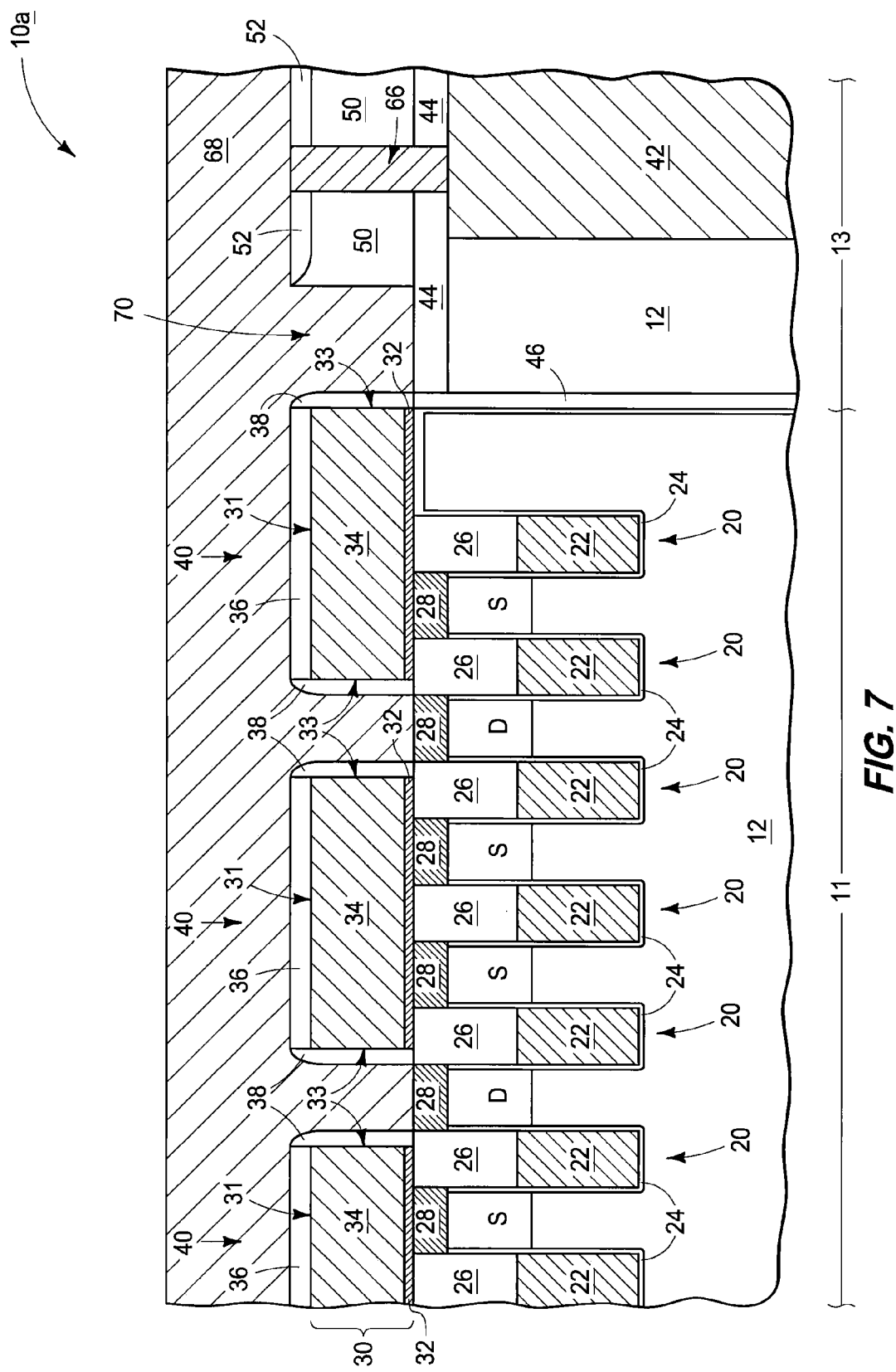

Referring to FIG. 7, an electrically conductive interconnect 66 is formed to extend through materials 44, 50 and 52, to electrically conductive material 42. The interconnect 66 may comprise any suitable electrically conductive composition or combination of compositions; such as, for example, one or more compositions selected from the group consisting of metals, metal-containing compositions, and conductively-doped semiconductor materials.

Exposed portions of material 50 between features 40 (such portions of material 50 are shown in FIG. 6) are removed with an etch selective for material 50 relative to caps 36, spacers 38 and material 52. For instance, in some embodiments the exposed portions of material 50 may be removed with an etch selective for silicon dioxide relative to silicon nitride.

After material 50 is removed, electrically conductive material 68 is deposited to connect with the drain regions D of transistors 20, and to couple with material 42 of peripheral region 13 through interconnect 66.

In the shown embodiment, a segment of material 50 is removed from over peripheral region 13 to create an opening 70 which is subsequent filled with conductive material 68 (the segment of material 50 is shown in FIG. 6, and the opening 70 is labeled in FIG. 7). The conductive material 68 within opening 70 terminates against insulative materials 44, 50, 52, and 46, as well as along the insulative material of sidewall 38. Accordingly, the conductive material within opening 70 does not problematically create an electrical short to any conductive components within either the memory region 11 or the peripheral region 13.

In some embodiments, the construction of FIG. 7 may be considered to comprise a conductive material 68 electrically coupling drain contacts (with the drain contacts being the conductive regions 28 over the drain regions D) with the region 42 of the peripheral region through the interconnect 66. The conductive material 68 is aligned to the drain contacts without utilization of a mask. Rather, the material 68 is formed within openings "self-aligned" to the drain contacts through the selective removal of material 50 (FIG. 6) relative to the sidewall spacers 38.

Figure 8:
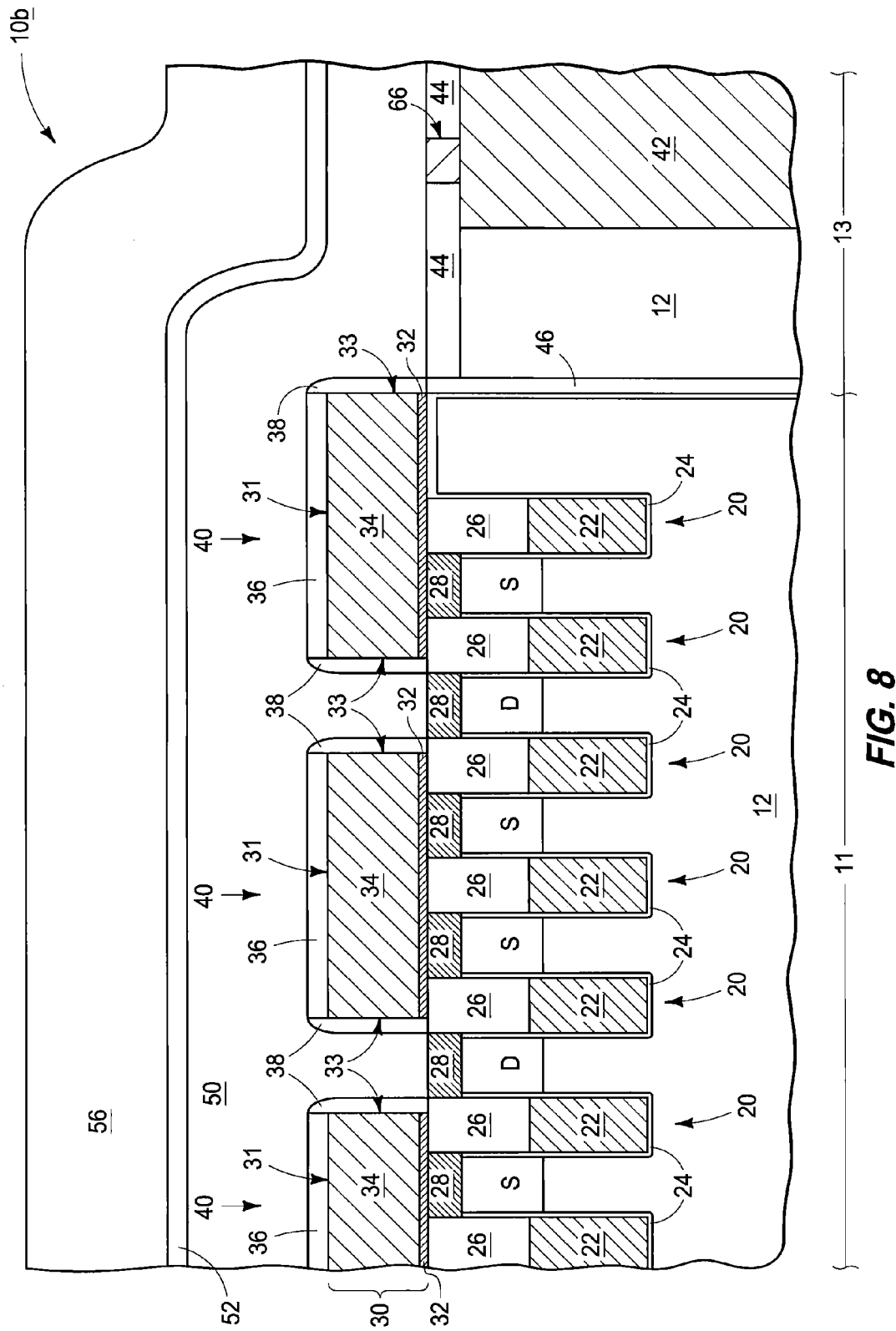
FIGS. 8 and 9 are diagrammatic cross-sectional views of a region of an example embodiment semiconductor construction at process stages of another example embodiment method.
Figure 9:
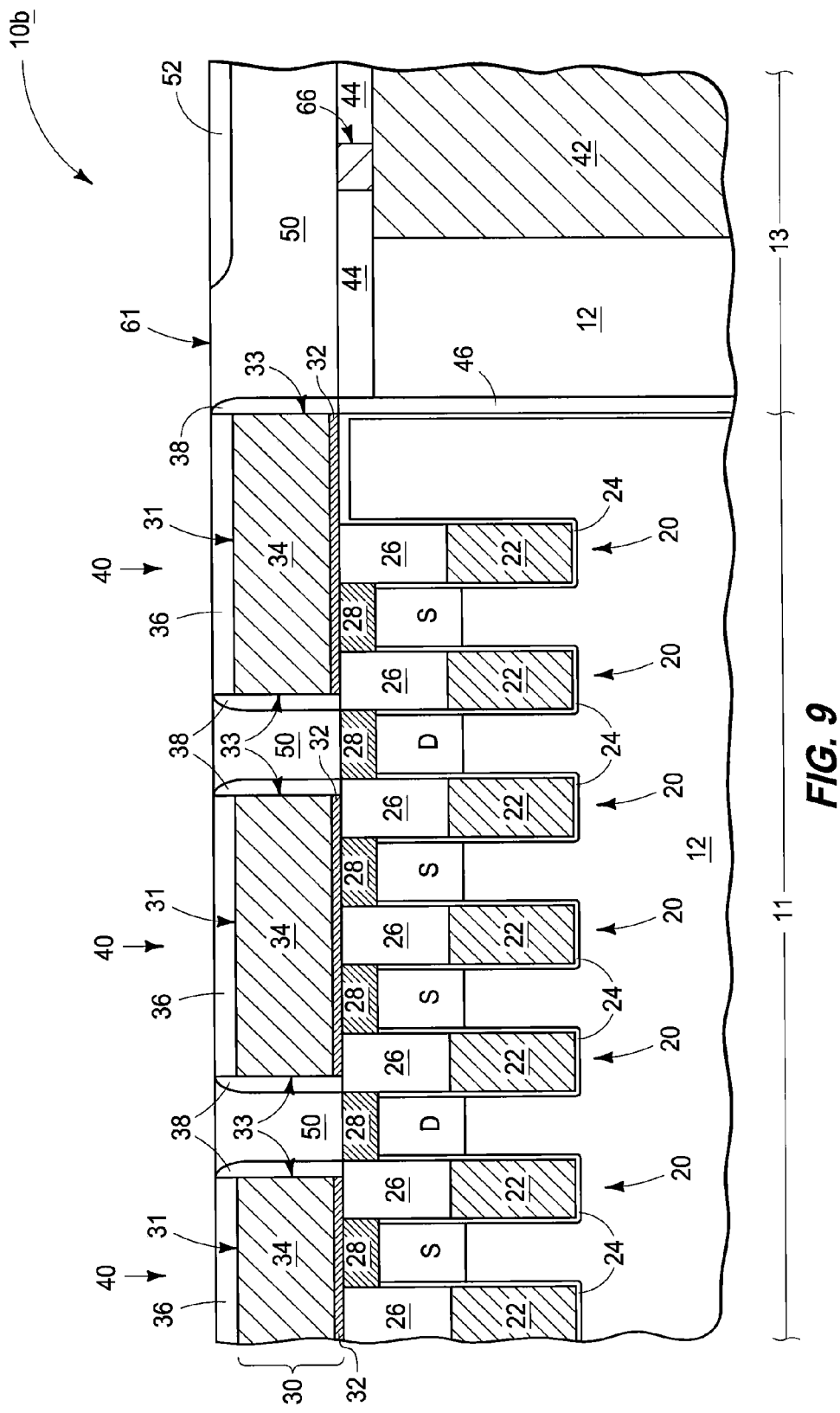

Although the processing of FIGS. 1-7 shows the entirety of interconnect 66 (FIG. 7) formed after creation of planarized surface 61 (FIG. 6), in other embodiments at least some of such interconnect may be present at an earlier processing stage. For instance, FIG. 8 shows a construction 10b at a processing stage analogous to that described above with reference to FIG. 3, but in which a portion of interconnect 66 extends through insulative material 44. Subsequent processing analogous to that described above with reference to FIGS. 4-6 may be conducted to form a construction shown in FIG. 9 having the planarized surface 61 formed over the portion of interconnect 66, and then additional processing may be conducted to form a construction analogous to that described above with reference to FIG. 7.

Figure 10:
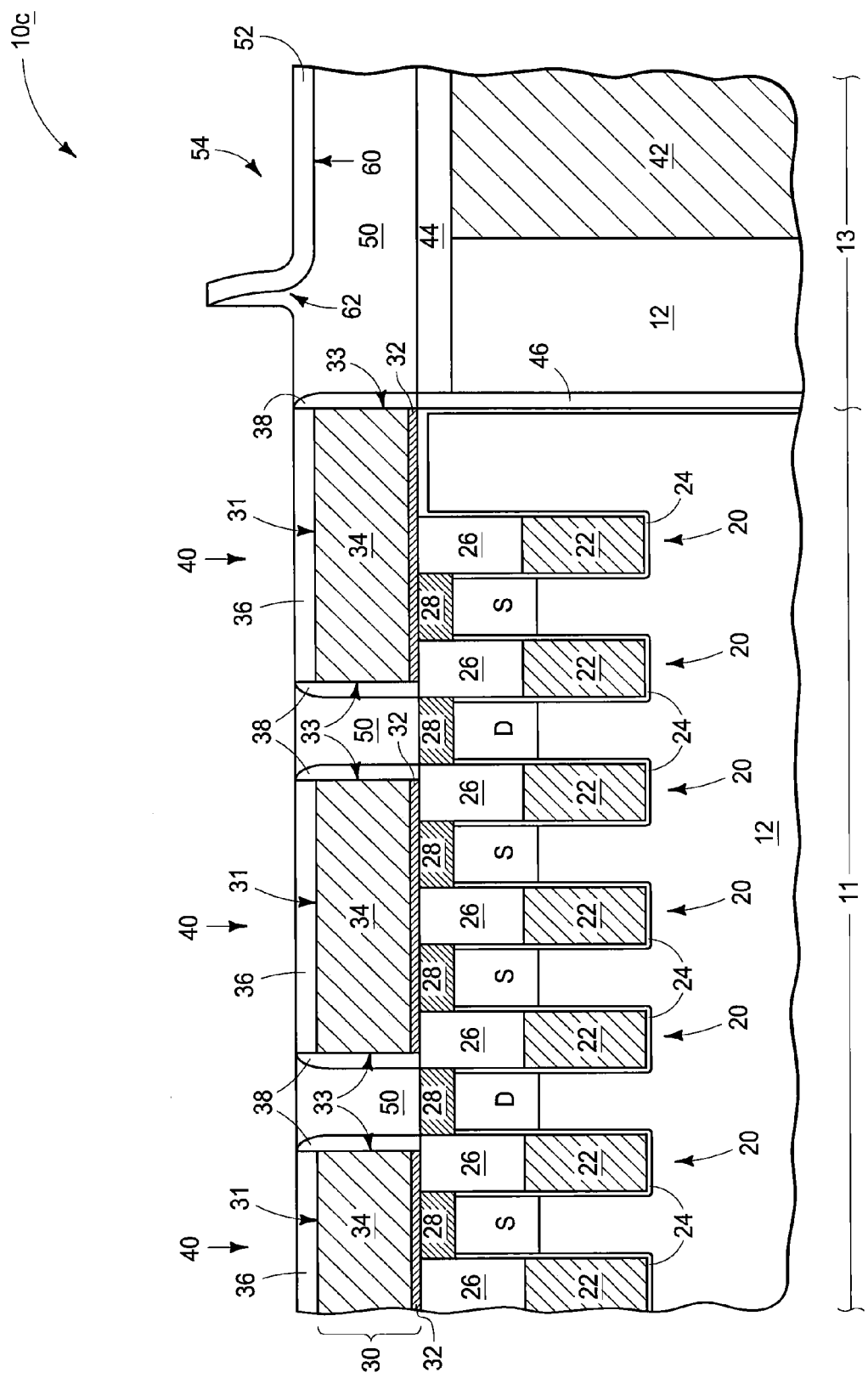
FIGS. 10 and 11 are diagrammatic cross-sectional views of a region of an example embodiment semiconductor construction at process stages of another example embodiment method. The process stage of FIG. 10 may follow that of FIG. 5 in some embodiments.

The processing described above with reference to FIGS. 5 and 6 removed materials 50 and 56 with planarization to form a planarized upper surface 61. In other embodiments, materials 50 and 56 may be removed with other suitable processing. For instance, FIG. 10 shows a construction 10c at a processing stage subsequent to FIG. 5 in accordance with an embodiment in which materials 50 and 56 are removed with an anisotropic etch selective for materials 50 and 56 relative to the caps 36 and material 52. In some embodiments, such anisotropic etch may be selective for silicon dioxide relative to silicon nitride.

The construction of FIG. 10 is similar to that of FIG. 6, except that structure 54 of material 52 retains the configuration of FIG. 5. Specifically, such structure retains the horizontally-extending bench 60 and the upwardly-extending stem 62 joined to such bench.

Figure 11:
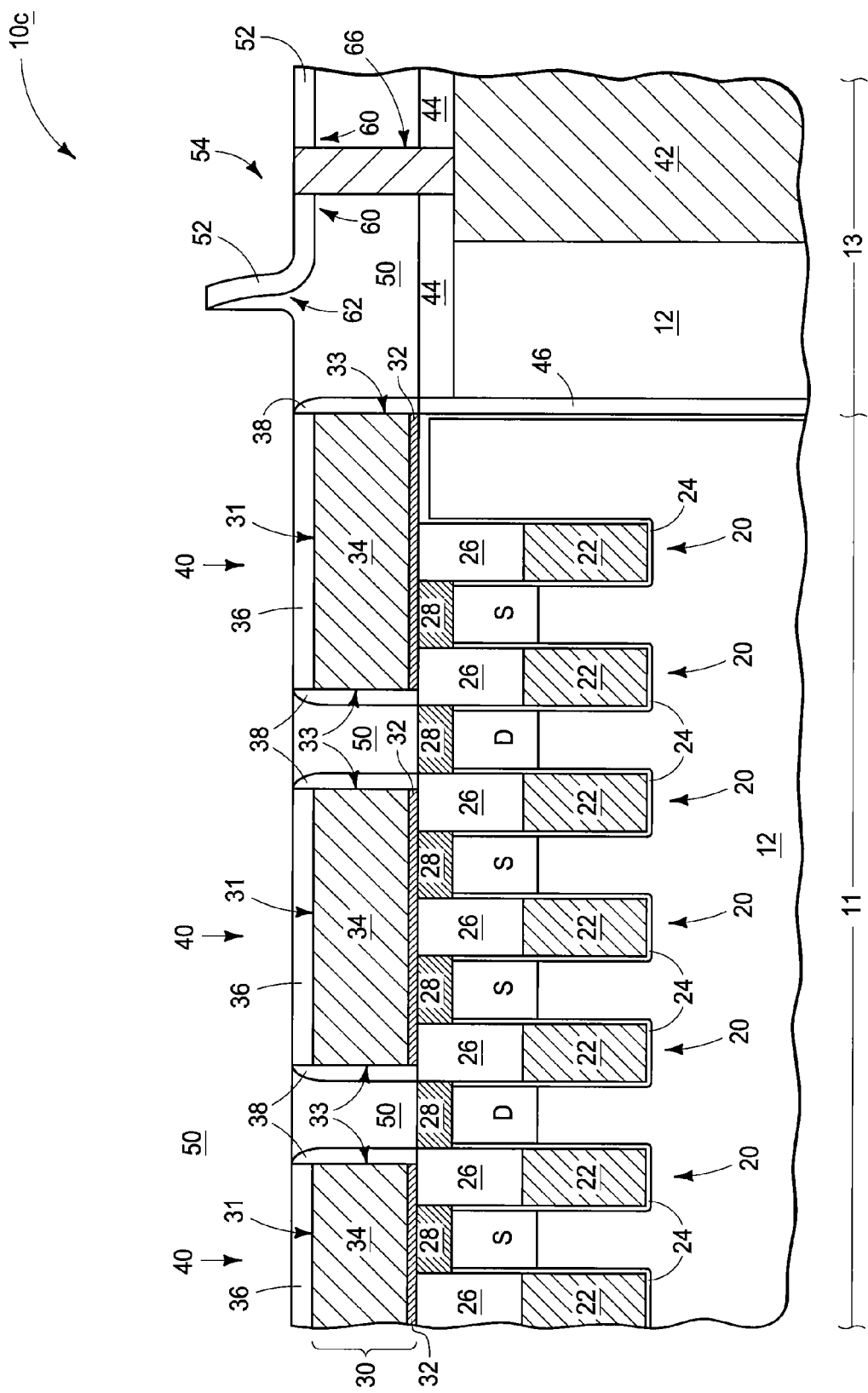

FIG. 11 shows an example processing stage subsequent to FIG. 10, and specifically shows the interconnect 66 extending through the horizontally-extending bench 60 of structure 54. In subsequent processing analogous to that described above with reference to FIG. 7, material 50 may be removed with an anisotropic etch and conductive material analogous to the material 68 of FIG. 7 may be formed to electrically connect with the drain regions D and the interconnect 66.

Figure 12:
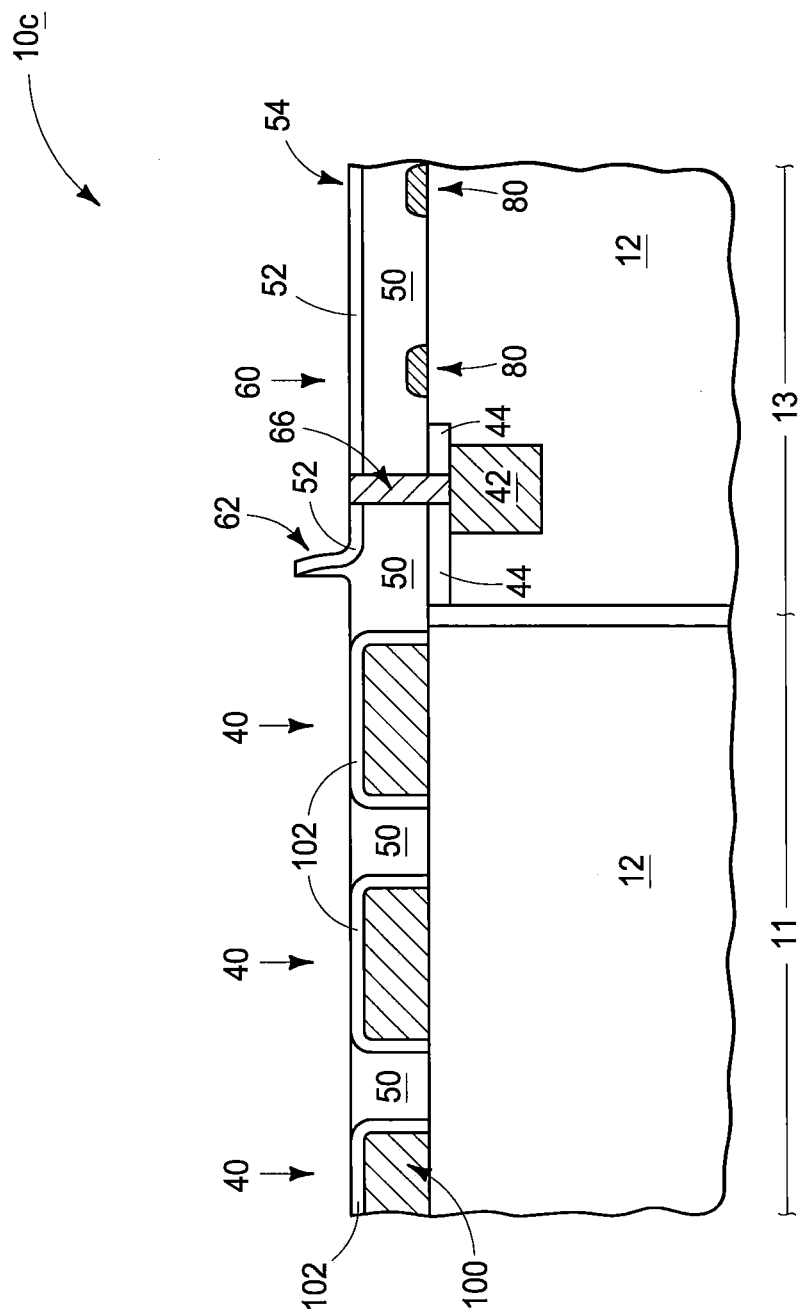
FIG. 12 is a simplified view of a construction at the processing stage of FIG. 11.

FIG. 12 shows a simplified view of a larger portion of construction 10c than is shown in FIG. 11. The view of FIG. 12 shows that features 40 are closely-spaced features across the memory region 11, and that more widely-spaced features 80 may be across the peripheral region. FIG. 12 also shows the etch stop material 52 extending across the features 80. The features 80 may be shorter than the features 40 (as shown) in some embodiments, and may be about the same height as features 40 in other embodiments.

The simplified features 40 of FIG. 12 have material 100 corresponding to the materials 32 and 34 of FIG. 11, and have insulative material 102 corresponding to the materials of the caps 36 and sidewall spacers 38 of FIG. 11. The insulative material 102 forms protective shells around the material 100.

In some embodiments, the materials 50 and 52 of FIG. 12 may be referred to as first and second electrically insulative materials, respectively; and the regions 11 and 13 of FIG. 12 may be referred to as first and second regions, respectively. Accordingly, the interconnect 66 may be considered to be within the second region 13, and to extend through both of the first and second electrically insulative materials 50 and 52.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, the invention includes a semiconductor construction. The construction includes a first region of a semiconductor substrate having first features, and includes a second region of the substrate having second features. The first features are more closely spaced than the second features. A first electrically insulative material is over the second region. The first electrically insulative material has a top surface below upper surfaces of the first features. A second electrically insulative material is over the first electrically insulative material. The second electrically insulative material has a different composition from the first electrically insulative material. The second electrically insulative material is configured as a structure having an upwardly-extending stem joined to a horizontally-extending bench. The bench has an upper surface at about a common level as upper surfaces of the first features. The stem extends to above the upper surfaces of the first features. An electrically conductive contact is within the second region and extends through the first and second electrically insulative materials.

In some embodiments, the invention includes a semiconductor construction. The construction includes a memory region of a semiconductor substrate, and a peripheral region of the substrate adjacent the memory region. Spaced-apart electrically conductive structures are within the memory region. Electrically insulative caps are over the electrically conductive structures. A first electrically insulative material is over the peripheral region, and has a top surface below upper surfaces of the electrically insulative caps. A second electrically insulative material is over the first electrically insulative material and has a different composition from the first electrically insulative material. The second electrically insulative material is configured as a structure having an upwardly-extending stem joined to a horizontally-extending bench. The bench has an upper surface at about a common level as upper surfaces of the electrically insulative caps. The stem extends to above the upper surfaces of the electrically insulative caps. An electrically conductive contact is within the peripheral region and extends through the first and second electrically insulative materials.

In some embodiments, the invention includes a method of forming a semiconductor construction. A first electrically insulative material is formed to extend across a memory region of a semiconductor substrate, and to extend across a peripheral region of the substrate adjacent the memory region. A plurality of spaced-apart electrically conductive structures are within the memory region, and are covered with electrically insulative caps. The first electrically insulative material extends over the caps. The first electrically insulative material is at a first level over the memory region and drops to a second level, below the first level, over the peripheral region. A second electrically insulative material is formed over the first electrically insulative material, with the second electrically insulative material having a different composition from the first electrically insulative material. The second electrically insulative material forms a structure having a higher portion over the memory region, and having a lower portion over the peripheral region. A third material is over the second electrically insulative material. The third material is removed from over the higher portion of the second electrically insulative structure to expose said higher portion while leaving the third material over the lower portion of the second electrically insulative material structure. The exposed higher portion of the second electrically insulative material structure is removed while protecting the lower portion with the third material. After the exposed higher portion is removed, the first electrically insulative material is removed from over the caps while the third material is removed from over the lower portion of the second electrically insulative material structure.

In some embodiments, the invention includes a method of forming a semiconductor construction. Spaced-apart electrically conductive lines are formed across a memory region of a semiconductor substrate. Electrically insulative protective shells are formed to extend over upper surfaces of the conductive lines and along sidewalls of the conductive lines. The protective shells comprise silicon nitride. A first silicon dioxide-containing material is formed to extend across the memory region of the semiconductor substrate, and to extend across a peripheral region of the substrate adjacent the memory region. The first silicon dioxide-containing material extends over the protective shells and between the protective shells. The first silicon dioxide-containing material is at a first level over the memory region and drops to a second level, below the first level, over the peripheral region. An etch stop material is formed over the first silicon dioxide-containing material. The etch stop material comprises silicon nitride. The etch stop material forms a structure having a higher portion over the memory region, and having a lower portion over the peripheral region. A second silicon dioxide-containing material is formed over the etch stop material structure. The second silicon dioxide-containing material is removed from over the higher portion of the etch stop material structure to expose said higher portion while leaving the second silicon dioxide-containing material over the lower portion of the structure. The exposed higher portion of the structure is removed while protecting the lower portion with the second silicon dioxide-containing material. After the exposed higher portion is removed, the first silicon dioxide-containing material is removed from over the protective shells while the second silicon dioxide-containing material is removed from over the lower portion of the etch stop material structure.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A semiconductor construction, comprising:
   a first region of a semiconductor substrate having first features, and a second region of the substrate having second features; the first features being more closely spaced than the second features;
   a first electrically insulative material over the second region, and having a top surface below upper surfaces of the first features;
   a second electrically insulative material over the first electrically insulative material and having a different composition from the first electrically insulative material; the second electrically insulative material being configured as a structure having an upwardly-extending stem joined to a horizontally-extending bench; the bench having an upper surface at about a common level as upper surfaces of the first features; the stem extending to above the upper surfaces of the first features; and
   an electrically conductive contact within the second region and extending through the first and second electrically insulative materials.

2. The construction of claim 1 wherein the first features are electrically conductive lines covered by silicon nitride caps; and wherein the second electrically insulative material is silicon nitride.

3. The construction of claim 2 wherein the electrically conductive lines are over, and electrically coupled with, source regions of access transistors.

4. The construction of claim 2 wherein the first electrically insulative material is silicon dioxide.

5. A semiconductor construction, comprising:
   a memory region of a semiconductor substrate, and a peripheral region of the substrate adjacent the memory region;
   spaced-apart electrically conductive structures within the memory region;
   electrically insulative caps over the electrically conductive structures;
   a first electrically insulative material over the peripheral region, and having a top surface below upper surfaces of the electrically insulative caps;
   a second electrically insulative material over the first electrically insulative material and having a different composition from the first electrically insulative material; the second electrically insulative material being configured as a structure having an upwardly-extending stem joined to a horizontally-extending bench; the bench having an upper surface at about a common level as upper surfaces of the electrically insulative caps; the stem extending to above the upper surfaces of the electrically insulative caps; and an electrically conductive contact within the peripheral region and extending through the first and second electrically insulative materials.

6. The construction of claim 5 wherein the electrically conductive structures are lines.

7. The construction of claim 5 wherein the electrically conductive structures are lines extending over, and electrically coupled with, source regions of access transistors.

8. The construction of claim 5 wherein the electrically insulative caps and the second electrically insulative material comprise a common composition.

9. A semiconductor construction, comprising:

a first region of a semiconductor substrate having first features, and a second region of the substrate having second features; the first features being more closely spaced than the second features; the first and second features being electrically conductive, and comprising a same electrically conductive composition as one another; the semiconductor substrate comprising monocrystalline silicon;

a first electrically insulative material over the second region, and having a top surface below upper surfaces of the first features;

a second electrically insulative material over the first electrically insulative material and having a different composition from the first electrically insulative material; the second electrically insulative material being configured as a structure having an upwardly-extending stem joined to a horizontally-extending bench; the bench having an upper surface at about a common level as upper surfaces of the first features; the stem extending to above the upper surfaces of the first features; and an electrically conductive interconnect within the second region and extending through the first and second electrically insulative materials to electrically contact an electrically conductive material under and directly against the first electrically insulative material.

* * * * *